United States Patent
Singh et al.

(10) Patent No.: US 9,178,519 B2
(45) Date of Patent: Nov. 3, 2015

(54) CLOCK SIGNAL GENERATOR

(71) Applicants: Prabhjot Singh, Noida (IN); Sachin Miglani, Kurukshetra (IN)

(72) Inventors: Prabhjot Singh, Noida (IN); Sachin Miglani, Kurukshetra (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 144 days.

(21) Appl. No.: 14/173,827

(22) Filed: Feb. 6, 2014

(65) Prior Publication Data

US 2015/0222271 A1    Aug. 6, 2015

(51) Int. Cl.
*H03K 21/00*    (2006.01)
*H03K 21/10*    (2006.01)
*H03K 3/017*    (2006.01)

(52) U.S. Cl.
CPC ............... *H03K 21/10* (2013.01); *H03K 3/017* (2013.01)

(58) Field of Classification Search
CPC .......... H04N 2201/04768; H04N 2201/02443; H04N 2201/04798; H02M 3/156
See application file for complete search history.

(56) References Cited

U.S. PATENT DOCUMENTS

| 6,864,735 | B2 | 3/2005 | Joo |
| 7,668,022 | B2 | 2/2010 | Goller |
| 8,558,589 | B2 | 10/2013 | Dahan |
| 2003/0067533 | A1* | 4/2003 | Omori ..................... B41J 2/471 347/248 |
| 2005/0218956 | A1 | 10/2005 | LaBerge |

* cited by examiner

*Primary Examiner* — Sibin Chen
(74) *Attorney, Agent, or Firm* — Charles Bergere

(57) ABSTRACT

A clock generator suitable for use with memory devices enables generation of memory clock signals having odd or even division ratios, an optional phase shift and a 50% duty cycle. First and second clock gate circuits receive a base clock signal and an inverted version thereof, respectively, and are both gated by the output of two comparators that are set when a value of a down counter receiving the base clock signal reaches a predetermined value. The clock gate circuits each include a multiplexer and D-type flip-flop. The output from either flip-flop, or both their outputs 'ORed' together, may be used as a memory clock depending on the desired division ratio and phase shift. The generator is particularly suitable for DDR memory applications that require both edges of the clock signal are evenly placed for launching data on both rising and falling edges.

17 Claims, 4 Drawing Sheets

CLOCK SIGNAL GENERATOR

BACKGROUND OF THE INVENTION

The present invention relates generally to a clock signal generator and, more particularly, to the generation of clock signals for memory devices or for synchronous interfaces such as communications interfaces.

In a system where a memory controller is connected to one or more memory devices (such as dual data rate (DDR) or static random access (SRAM) memory) via an interface, the memory controller generates a clock signal for the memory interface. All other interface signals (such as addresses, data and command signals) that are sent from the memory controller over the interface to the memory device(s) are synchronous with this clock signal.

The memory devices require specific and precise timing at their data, address and clock inputs. As typical memory boards have dense routing in terms of numerous wires, providing suitable and exact timing of the data and address signals, as well as the corresponding clock signals, places a high requirement on the memory interface. If the memory interface fails to meet the requirements, the timing at the inputs to the memory devices may be different from the timing at the corresponding outputs of the controlling devices, which may impair the overall performance of the memory systems.

In order to satisfy the timing requirements, conventional solutions shift the phase of the clock signals. Some known solutions employ phase locked loops (PLL) with phase mixers or delay locked loops (DLL) to optimize the phase relationship of a clock signal with regard to a data signal. However, PLLs and DLLs consume a considerable amount of silicon area and power and are time-consuming to characterize. Further, PLLs and DLLs are frequency band dependent and so cannot be used outside a specified frequency range. Other known solutions use shift registers to achieve a phase shift. However, when different clock division ratios are required, this necessitates increasing the number of flip-flops and therefore, silicon area and power requirements. Another known arrangement employs a clock divider counter value, comparator and a combination of latches and logic gates to phase shift a divided base clock signal. However, this arrangement cannot generate a clock signal with a 50% duty cycle nor can it be used for dual data rate interfaces which require that both edges of the clock signal are evenly placed for launching data on both rising and falling edges of the clock.

Thus it would be advantageous to provide an apparatus for generating a clock signal that mitigated at least some of the above-mentioned disadvantages of the known systems.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
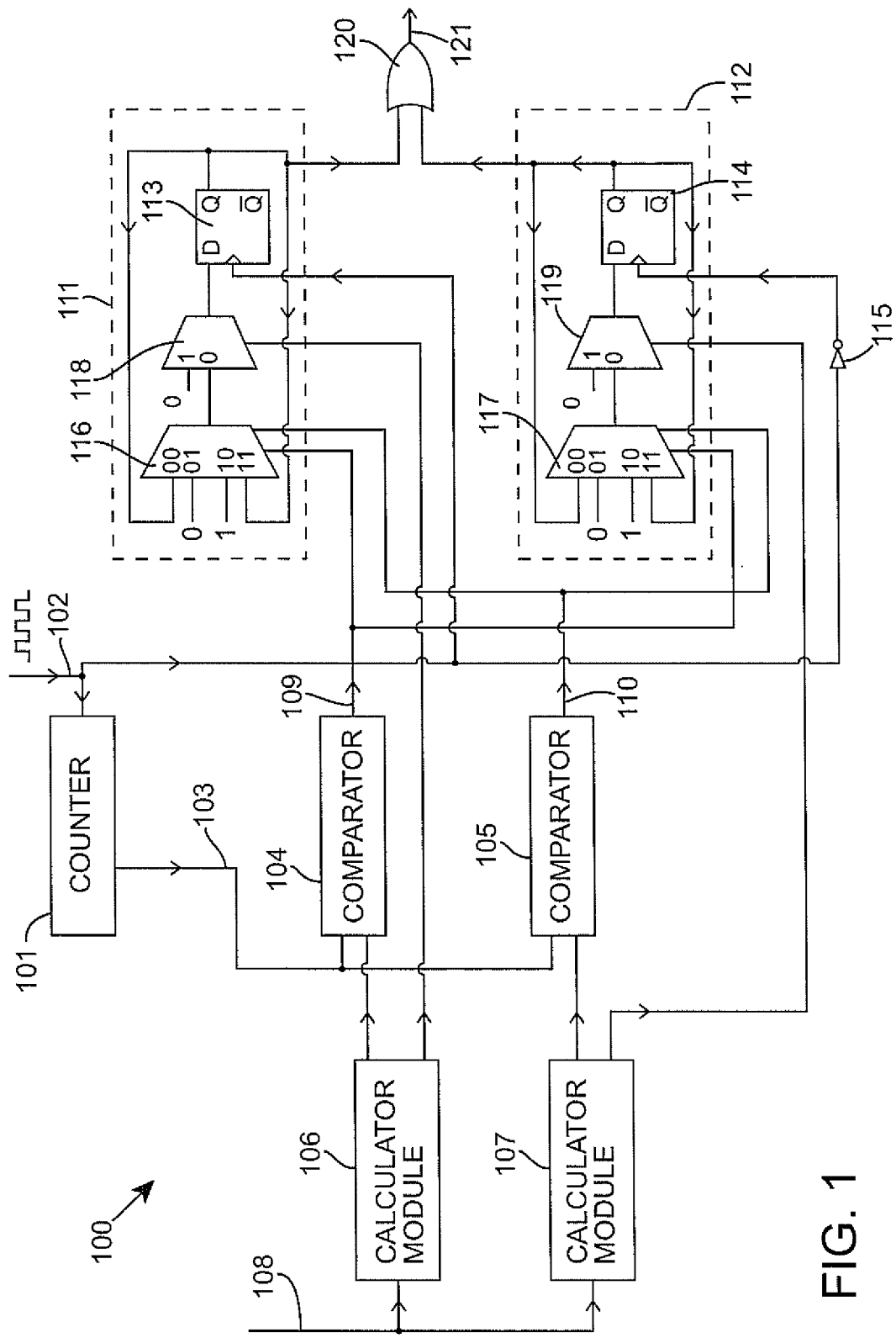
FIG. 1 is a simplified block diagram of apparatus for generating a clock signal in accordance with an embodiment of the invention.

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides a clock signal generator for generating a divided clock signal from a base clock signal. The clock signal generator includes a clock gate circuit for receiving the base clock signal, and a counter that also receives the base clock signal. First and second comparators coupled to the counter and to the clock gate circuit compare a received counter value with first and second reference values, respectively, and generate first and second clock gate enable signals.

Advantageously, by feeding the outputs of the two comparators to the clock gate circuit, divided clock signals with either odd or even division ratios and having a 50% duty ratio can be generated.

In another embodiment, the present invention provides a method of generating a clock signal, including providing a counter and a clock gate circuit with a base clock input signal; comparing a counter output value with first and second reference values to generate first and second clock gate enable signals; and applying the first and second clock gate enable signals to the clock gate circuit.

In one embodiment, a clock divider value is used to phase shift a divided clock signal at a resolution of half a clock period of a base clock. Advantageously, the present invention can generate a divided clock signal for both odd and even division ratios and will support all integer division ratios except for a 1:1 division ratio. A desired phase shift for the generated clock signal is programmable.

The present invention can also be used for both single rate and dual rate memory interfaces. Dual data rate interfaces require that both edges of a clock signal are evenly placed for launching data on both rising and falling edges of the clock. The present invention satisfies this criterion.

Advantageously, the present invention can provide a divided clock signal with a 50% duty cycle. Further, the operation of the clock generator of the present invention is independent of frequency.

In applications where the present invention is used for generating a clock signal for a memory interface, use may be made of available divider counter registers and phase delayed base clock edges, thereby saving on silicon area and power consumption. A typical operating frequency range is 0.4 MHz to 200 MHz with a base clock frequency of 400 MHz.

Referring now to FIG. 1 there is illustrated a simplified block diagram of clock generator circuit 100 for generating a clock signal in accordance with one embodiment of the invention. A counter 101 receives a base clock signal on line 102. In this embodiment, the base clock signal has a 50% duty cycle and a frequency of typically 400 MHz. Also in this embodiment, the counter 101 is a down counter of width log 2(DIV_RATIO) where DIV_RATIO is a variable, pre-set division ratio. The counter 101 can produce a divided output clock signal that can be used as a reference clock signal. In one example, this reference clock signal is generated based on counter values so that the reference signal is set to a logical '1' when the counter value is zero and is reset to a logical '0' when the counter value reaches the value equal to DIV_RATIO/2. In applications where the clock generator circuit 100 is used with memory systems, the reference clock signal can be used to synchronise interface signals such as address and data signals.

The counter value is output on line 103 and fed to first inputs of first and second comparators 104 and 105 respectively. A second input of the first comparators 104 is coupled to a first output of a first calculator module 106, and a second input of the second comparator 105 is coupled to a first output of a second calculator module 107. Each of the first and second calculator modules 106, 107 receives an input signal on line 108, which sets an operating mode (MODE) of the clock generator circuit 100 and that also may relate to a desired division ratio and a programmable phase shift (PHASE SHIFT). In applications where the clock generator circuit 100 is used to generate a memory clock, an operating mode may also relate to use with either a single data rate (SDR) interface or a dual data rate interface (DDR). For a single data rate interface, the memory clock needs to be shifted half a cycle with respect to the reference clock, while for a dual data rate interface, the memory clock needs to be shifted a quarter of a cycle with respect to the reference clock. The programmable phase shift (or delay value) relates to an additional phase shift (positive or negative) of the memory clock with respect to the reference clock with a resolution of half a base clock cycle.

The first calculator module 106 calculates a first reference value for comparison in the first comparator 104 with the counter 101 output value. An output of the first comparator 104 on line 109 is either set or reset depending on the result of the comparison. Similarly, the second calculator module 107 calculates a second reference value for comparison in the second comparator 105 with the counter 101 output value. An output of the second comparator 105 on line 110 is either set or reset depending on the result of this comparison. In one embodiment, the first reference value (REF_VALUE_1) is calculated in the first calculator module 106 in accordance with the equation: REF_VALUE_1=(MODE=SDR? DIV_RATIO:3*DIV_RATIO/2)+PHASE SHIFT. That is, in Single Data Rate (SDR) Mode, REF_VALUE_1=DIV_RATIO+PHASE_SHIFT, while for Dual Data Rate (DDR) mode, REF_VALUE_1=3*DIV_RATIO/2+PHASE_SHIFT. The second reference value (REF_VALUE_2) is calculated in the second calculator module 107 in accordance with the equation: REF_VALUE_2=(MODE=SDR? 0:DIV_RATIO/2)+PHASE_SHIFT. That is, in SDR mode, REF_VALUE_2=PHASE_SHIFT, and in DDR mode, REF_VALUE_2=DIV_RATIO/2+PHASE_SHIFT. The first reference value can be thought of as an indicator of the position of a positive-going (rising) edge of the desired memory clock signal with reference to the reference clock signal (in half base clock period resolution), while the second reference value can be thought of as an indicator of the position of a negative-going (falling) edge of the desired memory clock signal with reference to the reference clock signal (in half base clock period resolution). In this embodiment, positive pulses of width equal to the base clock period are generated by the first comparator 104 whenever the counter value on line 103 reaches a value equal to (REF_VALUE_1)/2. For all other values of the counter value, the output of the first comparator 104 is reset to a logical '0.' Similarly, positive pulses of width equal to the base clock period are generated by the second comparator 105 whenever the counter value on line 103 reaches a value equal to (REF_VALUE_2)/2. For all other values of the counter value, the output of the second comparator 105 is reset to a logical '0.' The outputs of the first and second comparators 104, 105 serve as enable signals for first and second clock gate circuits 111, 112. The first and second clock gate circuits 111 and 112, respectively, receive the base clock signal and outputs from both of the first and second comparators 104, 105.

The first clock gate circuit 111 has a first flip-flop 113 whose clock input receives the base clock signal. The second clock gate circuit 112 has a second flip-flop 114 whose clock input receives an inverted version of the base clock signal (via an inverter 115). An output of the first clock gate circuit 111 is generated at the Q output of the first flip-flop 113 and is fed to an OR gate 120. An output of the second clock gate circuit 112 is generated at the Q output of the second flip-flop 114 and also is fed to the OR gate 120. The OR gate 120 outputs a clock signal on its output line 121 that is a divided and (optionally) phase-shifted version of the reference clock signal on line 103. The first clock gate circuit 111 also includes a first 4:1 multiplexer 116 having four data inputs and two selector inputs. Two of the four data inputs to the first multiplexer 116 are the Q output of the first flip-flop 113, and the remaining two data inputs of the first multiplexer 116 are fixed at a logical '0' and a logical '1.' The two selector inputs of the first multiplexer 116 comprise the outputs of the first and second comparators 104 and 105. The second clock gate circuit 112 includes a second 4:1 multiplexer 117 having four data inputs and two selector inputs. Two of the four data inputs to the second multiplexer 117 are the Q output of the second flip-flop 114, and the remaining two data inputs of the second multiplexer 117 are fixed at a logical '0' and a logical '1.' The two selector inputs of the second multiplexer 117 comprise the outputs of the first and second comparators 104 and 105.

An output of the first multiplexer 116 is fed to the D input of the first flip-flop 113 by way of a first switch 118, while an output of the second multiplexer 117 is fed to the D input of the second flip-flop 114 by way of a second switch 119. The first and second switches 118, 119 (which in this embodiment are included in the clock gate circuits 111 and 112 respectively, comprise 2:1 multiplexers), provide the option of effectively inhibiting either one of the clock gate circuits 111, 112, by setting the data input of each flip-flop 113, 114 at a logical '0', thereby fixing the Q output of the flip-flop, 113 or 114, at a fixed logical value so that only the clock signal generated by the other clock gate circuit appears at the output of the OR gate 120 on line 121. The first and second switches 118 and 119 are controlled by control signals generated by the first and second calculator modules 106, 107. Thus, a control signal appearing at a second output of the first calculator module 108 is coupled to the first switch 118 and a control signal appearing at a second output of the second calculator module 107 is coupled to the second switch 119. The logical state of a generated control signal depends on the inputs to the calculator modules, i.e., identifying a mode, a division ratio and a required phase shift. In one example, a divided clock signal having an even division ratio and a 50% duty cycle can be generated by the first clock gate circuit 111 alone. In another embodiment, a divided clock signal having an even division ratio, an additional phase shift and a 50% duty cycle can be generated by the second clock gate circuit 112 alone. A divided clock signal with an odd division ratio and 50% duty cycle can be generated by 'ORing' together the outputs of both the first and second clock gate circuits 111, 112.

Figure 2:
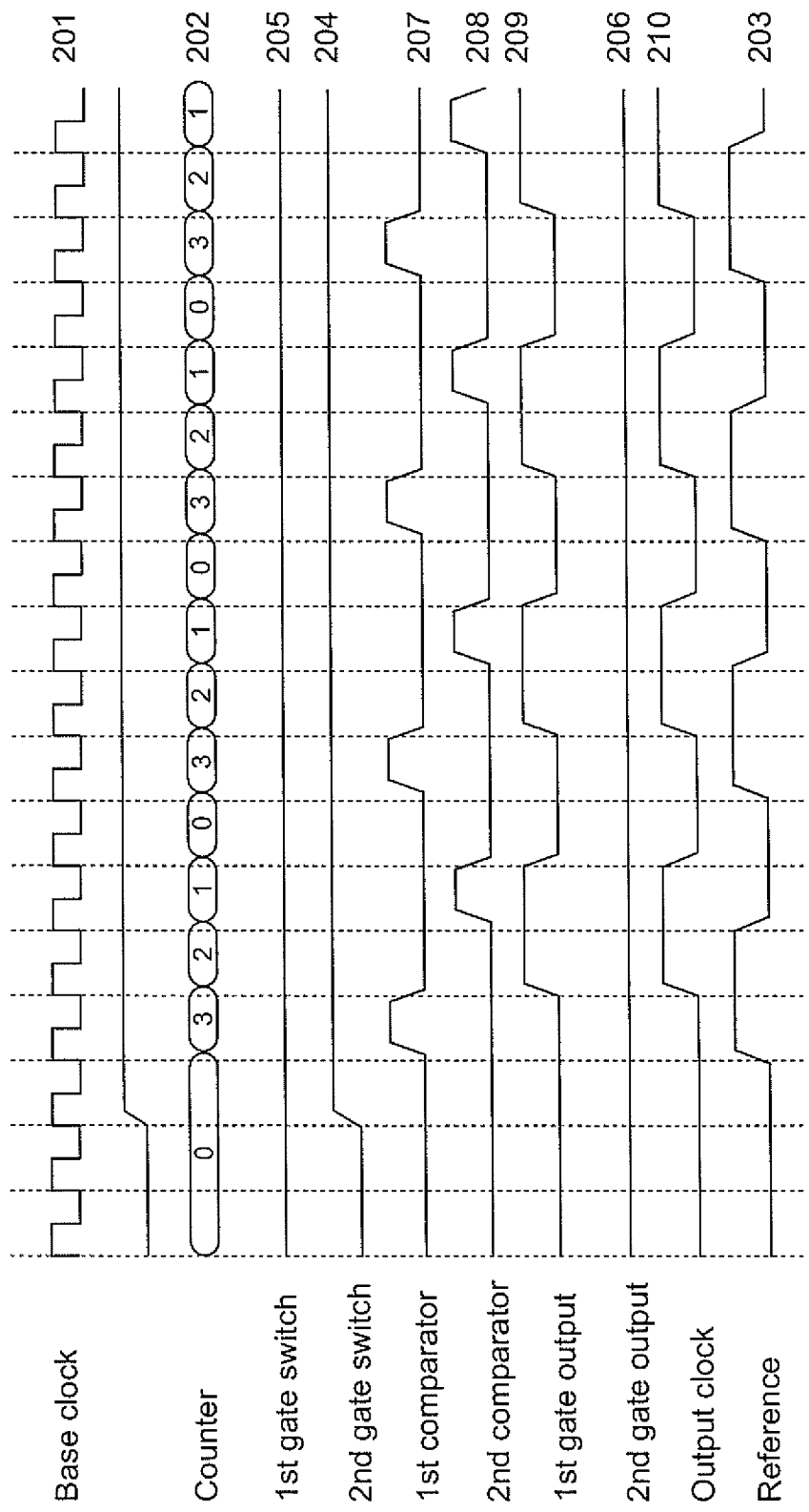
FIG. 2 is a timing diagram of a first clock waveform generated by the apparatus of FIG. 1 in a first mode of operation.

Reference will now be made to the timing diagram of FIG. 2, which illustrates the generation of a clock signal from a base clock signal for DDR use and which may be performed by the clock generator circuit 100 of FIG. 1. The generated clock signal is this example has an even division ratio (with respect to the base clock) of 4 and zero phase shift (with respect to the base clock) and a 50% duty cycle. For DDR memory use, there is a further requirement that the memory clock is phase shifted by 90 degrees with respect to the reference clock (generated by the counter). Such a clock signal is suitable for use with DDR memories. Trace 201 shows the base clock signal which is received by the counter 101. An inverted version of the base clock is received by the second clock gate circuit 112. Trace 202 shows the counter output value. The division ratio of the counter is set to 4 in this example. Similarly, the inputs to the calculator modules 106, 107 are set at a division ratio of 4 and a phase shift of zero and DDR mode, so that each calculator module can calculate the appropriate reference values to apply to the first and second comparators 104, 105. Trace 203 shows the reference clock which is output by the counter. The reference clock is synchronous with the base clock but has a frequency which is a quarter of the base clock's frequency.

In this example, only the output from the first clock gate circuit 111 is required. The second clock gate circuit 112 can be inhibited by a signal from the second calculator module 107 applied to the second switch 119. Trace 204 shows the enable/inhibit signal of a logical '1', which is received at a selector input of the second switch and trace 205 shows the resulting output from the second clock gate circuit 112 fixed at a logical '0'. Trace 206 shows the enable/inhibit signal of a logical '0', which is received at a selector input of the first switch 118 and which permits the output of the first multiplexer 116 to be received by the first flip-flop 113.

Trace 207 shows the output from the first comparator 104, which is set to a logical '1' whenever the counter output value matches (REF.VALUE 1)/2. Otherwise it is set to a logical '0'. Trace 208 shows the output from the second comparator 105, which is set to a logical '1' whenever the counter output value matches (REF_VALUE_2)/2. Otherwise, it is set to a logical '0'. The positive pulses from each of the comparators 104, 105 are one base clock period wide and in this embodiment occur every fourth cycle of the base clock. The output of the first comparator 104 is one base clock period ahead of the output of the second comparator 105.

Trace 209 is the output of the first clock gate circuit 111, i.e., the Q output from the first flip-flop 113. Trace 210 shows a waveform which is the output of the OR gate 120 on line 121 which in this example is the same as the output from the first clock gate circuit 111. This waveform has a 50% duty cycle and a frequency of a quarter of the base clock. Further, the phase of the output waveform is positively shifted by 90 degree with respect to the reference signal 203 as required for DDR applications. This frequency and phase relationship is obtained by virtue of the two calculated reference values and the outputs from the two comparators being used to gate the clock gate circuit.

Figure 3:
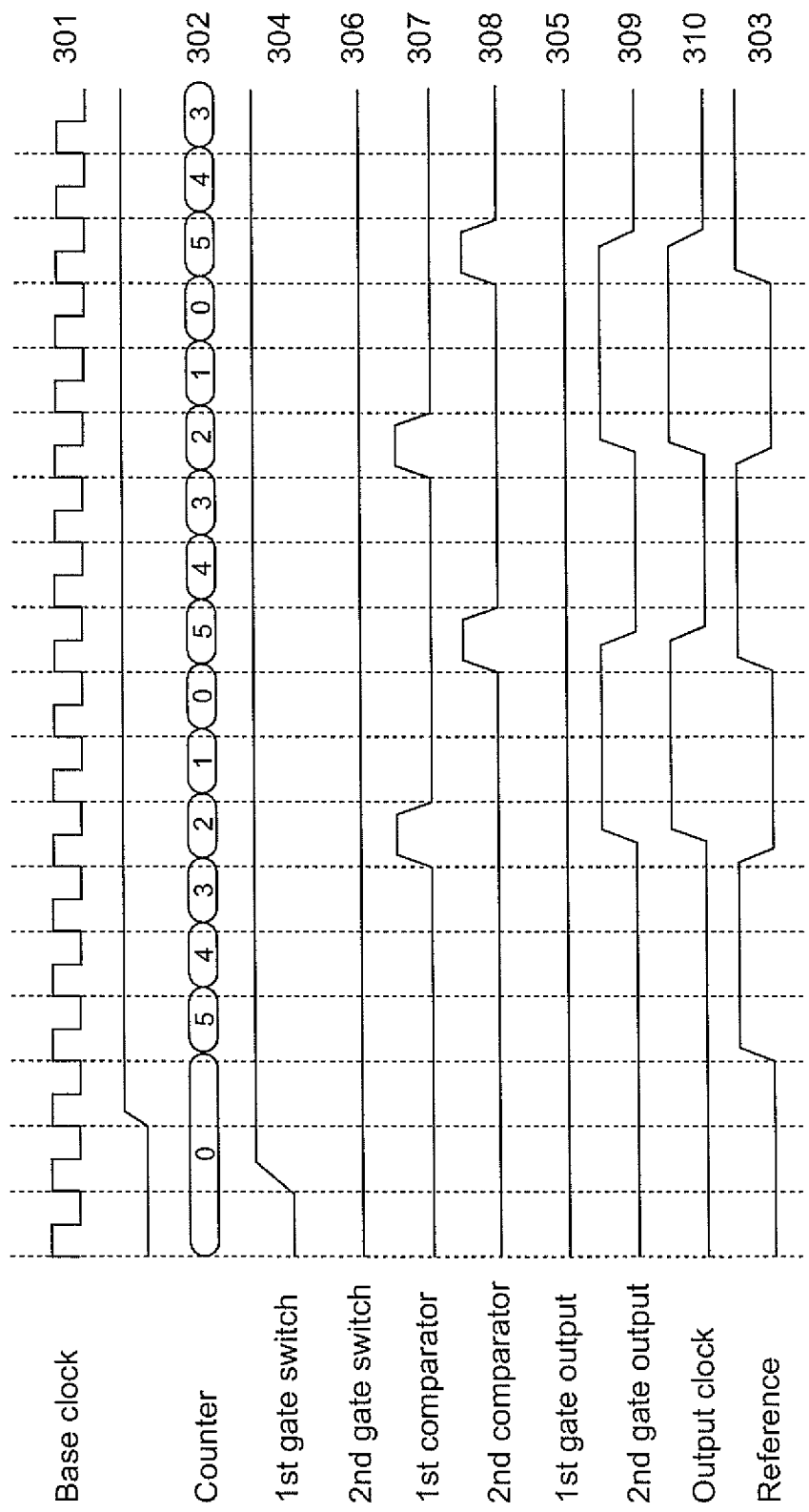
FIG. 3 is a timing diagram of a second clock waveform generated by the apparatus of FIG. 1 in a second mode of operation.

Reference will now be made to the timing diagram of FIG. 3 which illustrates the generation of a clock signal from a base clock signal for SDR use and which may be performed by the clock generator circuit 100 of FIG. 1. The generated clock signal is this example has an even division ratio (with respect to the base clock) of six (6), a phase shift (with respect to the base clock) of half a base clock period and a 50% duty cycle. For SDR memory use, there is a further requirement that the memory clock is phase shifted by 180 degrees with respect to the reference clock (generated by the counter). Trace 301 shows the base clock signal which is received by the counter 101. An inverted version of the base clock is received by the second clock gate circuit 112. Trace 302 shows the counter output value. The division ratio of the counter is set to 6 in this example. Similarly, the inputs to the calculator modules 106, 107 are set at a division ratio of 6 and a phase shift of half a base clock cycle, so that each calculator module can calculate the appropriate reference values to apply to the first and second comparators 104, 105. Trace 303 shows the reference clock which is output by the counter. The reference clock is synchronous with the base clock but has a frequency which is a sixth of the base clock's frequency.

In this example, only the output from the second clock gate circuit 112 is required so the first clock gate circuit 111 is inhibited by a signal from the first calculator module 106 applied to the first switch 118. Trace 304 shows the enable/inhibit signal of a logical '1', which is received at a selector input of the first switch 118 and trace 305 shows the resulting output from the first clock gate circuit 111 fixed at a logical '0'. Trace 306 shows the enable/inhibit signal of a logical '0', which is received at a selector input of the second switch 119 and which permits the output of the second multiplexer 117 to be received by the second flip-flop 114.

Trace 307 shows the output from the first comparator 104, which is set to a logical '1' whenever the counter output value matches (REF_VALUE_1)/2. Otherwise it is set to a logical '0'. Trace 308 shows the output from the second comparator 105 which is set to a logical '1' whenever the counter output value matches (REF_VALUE_2)/2. Otherwise, it is set to a logical '0'. The positive pulses from each of the comparators 104, 105 are one base clock period wide and in this example occur every sixth cycle of the base clock. The output of the first comparator 104 is three base clock periods ahead of the output of the second comparator 105.

Trace 309 is the output of the second clock gate circuit 112, i.e., the Q output from the second flip-flop 114. Trace 310 shows a waveform which is the output of the OR gate 120 on line 121, which in this example is the same as the output from the second clock gate circuit 112. This waveform has a 50% duty cycle and a frequency of a sixth of the base clock. Further, the phase of the output waveform is positively shifted by 180 degrees plus a half base clock period with respect to the reference signal 303 and by a half base clock period with respect to the base clock 301. The 180 degree phase shift with respect to the reference clock is required for SDR applications. This frequency and phase relationship is obtained by virtue of the two calculated reference values and the outputs from the two comparators being used to gate the clock gate circuit.

Figure 4:
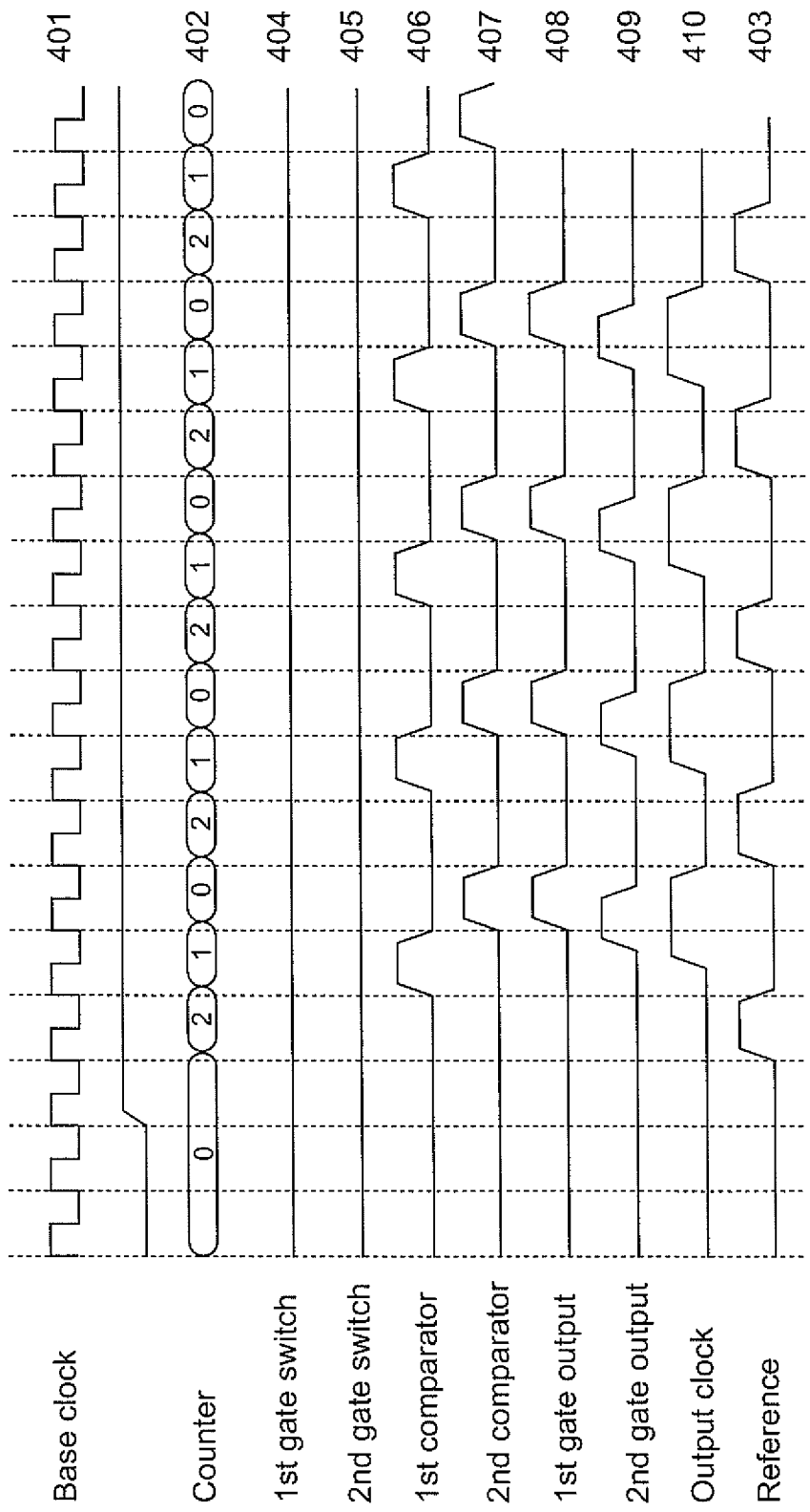
FIG. 4 is a timing diagram of a second clock waveform generated by the apparatus of FIG. 1 in a third mode of operation.

Reference will now be made to the timing diagram of FIG. 4, which illustrates the generation of a clock signal from a base clock signal for SDR use and which may be performed by the clock generator circuit 100 of FIG. 1. The generated clock signal is this example has an odd division ratio (with respect to the base clock) of three (3) and zero phase shift (with respect to the base clock) and a 50% duty cycle. For SDR memory use, there is a further requirement that the memory clock is phase shifted by 180 degrees with respect to the reference clock (generated by the counter). Such a clock signal is suitable for use with SDR memories. Trace 401 shows the base clock signal which is received by the counter 101. An inverted version of the base clock is received by the second clock gate circuit 112. Trace 402 shows the counter output value. The division ratio of the counter is set to 3 in this example. Similarly, the inputs to the calculator modules 106, 107 are set at a division ratio of 3 and a phase shift of zero and SDR mode, so that each calculator module can calculate the appropriate reference values to apply to the first and second comparators 104, 105 and also set the switches 118 and 119 appropriately. Trace 403 shows the reference clock which is output by the counter. The reference clock is synchronous with the base clock but has a frequency which is a third of the base clock's frequency.

In this example, the outputs from both the first clock gate circuit 111 and the second clock gate circuit 112 are required. Trace 404 shows the enable/inhibit signal of a logical '0', which is received at a selector input of the first switch 118 and which permits the output of the first multiplexer 116 to be received by the first flip-flop 113. The enable/inhibit signal 404 is generated by the first calculator module 106. Similarly, trace 405 shows the enable/inhibit signal of a logical '0', which is received at a selector input of the second switch 119 and which permits the output of the second multiplexer 117 to be received by the second flip-flop 114. The enable/inhibit signal 405 is generated by the second calculator module 106.

Trace 406 shows the output from the first comparator 104, which is set to a logical '1' whenever the counter output value matches (REF_VALUE_1)/2. Otherwise it is set to a logical '0'. Trace 407 shows the output from the second comparator 105, which is set to a logical '1' whenever the counter output value matches (REF_VALUE_2)/2. Otherwise, it is set to a logical '0'. The positive pulses from each of the comparators 104, 105 are one base clock period wide and in this example occur every third cycle of the base clock. The output of the first comparator 104 is one base clock period ahead of the output of the second comparator.

Trace 408 is the output of the first clock gate circuit 111, i.e., the Q output from the first flip-flop 113. This trace shows a waveform that has a frequency of a third of the base clock, is in synchronism with the base clock but is positively shifted with respect to the reference signal 403 by 240 degrees. Trace 409 is the output of the second clock gate circuit 112, i.e., the Q output from the second flip-flop 114. This trace shows a waveform that has a frequency of a third of the base clock, is in synchronism with the base clock but is positively shifted with respect to the reference signal 403 by 180 degrees. Trace 410 is the output of the OR gate 120, which ORs together the waveforms 408, 409 from the first and second clock gate circuits. This waveform output from the OR gate comprises an output memory clock, which has a frequency of one third of the base clock and has a 50% duty cycle. Further, the phase of the output clock waveform is positively shifted by 180 degrees with respect to the reference signal 403 as required for SDR applications. This frequency and phase relationship is obtained by virtue of the two calculated reference values, the outputs from the two comparators being used to gate the clock gate circuit and the combination of the two waveforms from the first and second clock gate circuits by the OR gate 120.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Further, the terms "assert" or "set" and "negate" (or "deassert" or "clear" or "reset") are used herein when referring to the rendering of a signal, status bit, or similar apparatus into its logically true or logically false state, respectively. If the logically true state is a logic level one, the logically false state is a logic level zero. If the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the functionality of the two calculator modules 106 and 107 of FIG. 1 may be merged into a single module. Similarly the functions performed by the two comparator modules 104 and 105 may be performed in a single module having the same capability as the two modules. Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "connected," or "coupled," to each other to achieve the desired functionality.

Further, those skilled in the art will recognize that boundaries between the above described operations are merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Further, the entire functionality of the modules shown in FIG. 1 may be implemented in an integrated circuit. Further, an integrated circuit may include the clock generator circuit 100 of FIG. 1 and may or may not include other functional blocks. Such an integrated circuit may be a package containing one or more dies. Also for example, the examples, or portions thereof, may be implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A clock generator circuit for generating a divided clock signal from a base clock signal, the clock generator circuit comprising:
   a first clock gate circuit that receives the base clock signal and first and second clock gate enable signals;
   a counter that receives the base clock signal;
   a first comparator having a first input coupled to an output of the counter and a second input that receives a first reference value, wherein the first comparator compares the counter output value with the first reference value and generates the first clock gate enable signal;
   a second comparator having a first input coupled to the output of the counter and a second input that receives a second reference value, wherein the second comparator compares the counter output value with the second reference value and generates the second clock gate enable signal;
   a second clock gate circuit, coupled to the first and second comparators, that receives the base clock signal and the first and second clock gate enable signals; and
   a logic gate, coupled to outputs of the first and second clock gate circuits, that generates the divided clock signal at an output thereof.

2. The clock generator circuit of claim 1, wherein the logic gate comprises
   an OR gate.

3. The clock generator circuit of claim 2, further comprising an inverter that receives the base clock signal and generates an inverted version of the base clock signal, wherein the second clock gate circuit receives the inverted version of the base clock signal.

4. The clock generator circuit of claim 3, further comprising first and second switches for selectively inhibiting either of the first or second clock gate circuits.

5. The clock generator circuit of claim 4, further comprising a calculator module for generating a control signal for said first and second switches depending on a predetermined operational mode of the clock generator circuit.

6. The clock generator circuit of claim 2, further comprising a calculator module for generating the first and second reference values.

7. The clock generator circuit of claim 6, wherein the first and second reference values are calculated depending on a predetermined operational mode of the clock generator circuit.

8. The clock generator circuit of claim 7, wherein the first and second reference values are calculated depending on a desired division ratio and phase shift of the generated divided clock signal.

9. The clock generator circuit of claim 2, wherein:
   the first clock gate circuit includes a first multiplexer and a first D type flip-flop, the first D type flip-flop having a data input connected to an output of the first multiplexer, a Q output connected to two data inputs of the first multiplexer and to the OR gate, and a clock input for receiving the base clock signal;
   the first multiplexer has additional data inputs set at a logical '1' and a logical '0', and selector inputs connected to the outputs of the first and second comparators for receiving the first and second clock gate enable signals;
   the second clock gate circuit includes a second multiplexer and a second D type flip-flop, the second D type flip-flop having a data input connected to an output of the multiplexer, a Q output connected to two data inputs of the second multiplexer, and to the OR gate, and a clock input for receiving an inverted version of the base clock signal, and
   the second multiplexer has additional data inputs set at a logical '1' and a logical '0', and selector inputs connected to the outputs of the first and second comparators for receiving the first and second clock gate enable signals.

10. The clock generator circuit of claim 1, wherein:
    the first clock gate circuit includes a multiplexer and a D type flip-flop, the D type flip-flop having a data input connected to an output of the multiplexer, a Q output connected to two data inputs of the multiplexer, and a clock input for receiving the base clock signal, and
    the multiplexer has additional data inputs set at a logical '1' and a logical '0', and selector inputs connected to the outputs of the first and second comparators for receiving the first and second clock gate enable signals.

11. A clock generator circuit for generating a divided clock signal from a base clock signal, the clock generator circuit comprising:
    a counter that receives the base clock signal and generates a count value;
    a first comparator that receives and compares the count value and a first reference value, and generates a first clock gate enable signal;
    a second comparator that receives and compares the count value and a second reference value, and generates a second clock gate enable signal;
    a first clock gate circuit, coupled to the first and second comparators, for receiving the base clock signal and first and second clock gate enable signals;
    a second clock gate circuit, coupled to the first and second comparators, for receiving the base clock signal and the first and second clock gate enable signals; and
    an OR gate coupled to an output of the first clock gate circuit and an output of the second clock gate circuit, wherein the OR gate generates the divided clock signal at an output thereof.

12. The clock generator circuit of claim 11, wherein the first clock gate circuit comprises:
    a first multiplexer;
    a first D type flip-flop having a data input connected to an output of the first multiplexer, a Q output connected to two data inputs of the first multiplexer, and a clock input that receives the base clock signal; and
    a first switch, connected between an output of the first multiplexer and the data input of the first D type flip-flop, wherein the first multiplexer has additional data inputs set at a logical '1' and a logical '0', and selector inputs connected to the outputs of the first and second comparators for receiving the first and second clock gate enable signals.

13. The clock generator circuit of claim 12, wherein the second clock gate circuit comprises:
    a second multiplexer;

a second D type flip-flop having a data input connected to an output of the second multiplexer, a Q output connected to two data inputs of the second multiplexer, and a clock input that receives the base clock signal; and a second switch, connected between an output of the second multiplexer and the data input of the second D type flip-flop, wherein the second multiplexer has additional data inputs set at a logical '1' and a logical '0', and selector inputs connected to the outputs of the first and second comparators for receiving the first and second clock gate enable signals.

14. The clock generator circuit of claim 13, further comprising a calculator module for generating the first and second reference values.

15. The clock generator circuit of claim 14, wherein the first and second reference values are calculated depending on a predetermined operational mode of the clock generator circuit.

16. The clock generator circuit of claim 15, wherein the first and second reference values are calculated depending on a desired division ratio and phase shift of the generated divided clock signal.

17. An integrated circuit including a clock generator circuit for generating a divided clock signal from a base clock signal, wherein the clock generator circuit comprises:

a first clock gate circuit for receiving the base clock signal;

a counter for receiving the base clock signal;

a first comparator having an input coupled to an output of the counter, and an output coupled to an input of the first clock gate circuit, wherein the first comparator compares a counter output value with a first reference value, and generates a first clock gate enable signal;

a second comparator having an input coupled to the output of the counter, and an output coupled to an input of the clock gate circuit, wherein the second comparator compares the counter output value with a second reference value, and generates a second clock gate enable signal;

a second clock gate circuit that receives the base clock signal and the first and second clock gate enable signals; and an OR gate coupled to an output of the first clock gate circuit and an output of the second clock gate circuit, wherein the OR gate generates the divided clock signal.

* * * * *